July 4, 1961 B. SALZBERG 2,991,366

SEMICONDUCTOR APPARATUS

Filed Nov. 29, 1957

INVENTOR.

Bernard Salzberg

BY

ATTORNEYS 2,991,366
SEMICONDUCTOR APPARATUS
Bernard Salzberg, Ridge Rock Lane, East Norwich, N.Y.
Filed Nov. 29, 1957, Ser. No. 699,656
6 Claims. (Cl. 250—83.3)

This invention relates to radiation detectors or counters, and particularly to a radiation detector or counter employing a semiconductor junction diode.

Semiconductor junction diodes are now well known and commonly comprise a region of P-type material in contact with a region of N-type material, the interface therebetween being called the junction. Suitable electrodes are provided at the outer ends of the P and N regions, for applying signals. Present commercial diodes commonly consist of a wafer of germanium or silicon prepared so that on one side of an interface (the junction) conductivity is P-type and on the other side N-type. The conductivity of one of these regions is usually much greater than that of the other. Both regions contain free electrons and holes serving as carriers, but in the P region the carriers are predominantly holes whereas in the N region they are predominantly electrons.

When a voltage of positive polarity is applied to the P end of the diode, conduction is said to be in the forward direction and the diode current can attain comparatively large values at relatively low voltages. For zero applied voltage, the diode current is zero. On the other hand, when the voltage is applied in the back or reverse direction, that is, when the negative polarity of the applied voltage is connected to the P-side, the diode current is very small and sensibly constant at low voltages. The current increases slowly with increasing voltage until a point is reached called the "breakdown" voltage, whereupon the current rises abruptly to comparatively large values.

Certain types of junction diodes exhibit what is known as "avalanche" breakdown. As now understood, the avalanche phenomenon is a process taking place in semiconductor junction diodes which is somewhat similar to the cumulative collision ionization that occurs in a gas discharge. When a reverse voltage is applied to the diode, a thin layer depleted of majority carriers is established at and about the junction and lying mainly on the high-resistivity side thereof. Strong electric fields can be set up in this depletion layer with only moderate reverse voltages because the layer is thin. Thermally-generated minority carriers in the neighborhood of the depletion layer gain sufficient energy in traversing this region of high electric field to ionize neutral atoms. The electron-hole products of ionization cause ionization in turn, and thus the initial small thermally-generated current is greatly multiplied. Near what is termed the avalanche breakdown point the cumulative ionization increases very rapidly with voltage and results in a relatively abrupt onset of current.

Some junction diodes exhibit what is termed herein an "anomalous" region in the I–V characteristic thereof. This anomalous region occurs near the breakdown voltage and at relatively low current. Some diodes exhibit a series of such anomalous regions occurring at successively higher currents. These anomalous regions have been observed by workers in the art and have sometimes been termed "noise" regions since random pulses, of internal origin, can be observed with appropriate apparatus. In the detailed description given hereinafter it will be shown how the existence and location of these regions on the I–V characteristic can be determined.

It is a primary object of the present invention to provide a simple and effective radiation detector or counter utilizing diodes having such anomalous regions. It has been found that by applying to such a diode a voltage in the reverse direction in excess of the breakdown voltage, and inserting an impedance in series therewith to establish operation through the anomalous region, a radiation detector or counter can be obtained. When external radiation, such as external energetic particles or photons, impinges on the diode, corresponding current pulses are generated and can be counted or otherwise indicated by suitable apparatus.

It has been previously suggested to employ a semiconductor diode as a radiation counter by operating it in the reverse voltage region but well below breakdown. Such counters have very low sensitivity since essentially no current multiplication takes place in the diode, and hence very high auxiliary amplification is required. By contrast, the radiation counter of the present invention yields pulses of much larger amplitude which can readily be counted or displayed without requiring excessive additional amplification.

In radiation counters of the invention, pulses may also be produced by carriers of thermal origin within the diode, giving rise to a background count. This background count will depend upon the particular diode employed and the temperature of operation. For many applications where the radiation is sufficiently intense, operation of the radiation counter at ordinary temperatures, such as room temperature, is satisfactory. Where, however, response to more feeble radiation is desired, the diode may be operated at a reduced temperature to decrease the thermally-generated background count which otherwise would mask the count due to incident radiation.

The invention will be more fully understood by reference to the following detailed description thereof, taken in conjunction with the drawings, in which.

Figure 1:
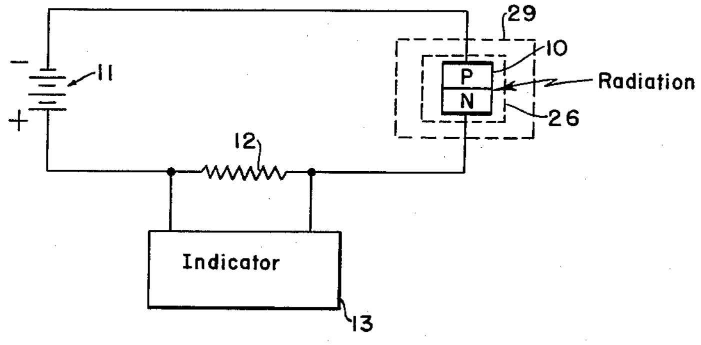
FIG. 1 is a schematic circuit diagram of a radiation detector or counter in accordance with the invention.

Referring now to FIG. 1, a P-N junction diode 10, a bias source 11, and a load impedance 12 are shown connected in series. The load impedance is here shown as a resistor. It is usually advantageous to avoid inductance and capacitance, but it will be understood that a certain amount of residual inductance and capacitance is present and ordinarily should be minimized.

The bias source 11 is shown as a battery but any other suitable source may be employed, as desired. The negative terminal of the source is connected to the P side of the diode 10 so that the diode voltage is in the reverse direction. The magnitude of the applied voltage is selected to be somewhat in execss of the breakdown voltage, and the value of the resistor 12 is selected so that operation takes place through an anomalous region of the diode characteristic. In accordance with conventional electronics terminology, the bias voltage and series resistance are selected to establish a D.-C. load line which passes through the anomalous region and hence establishes operation in that region. This will be explained more fully in connection with FIG. 3.

With operation established through the anomalous region of diode 10, when radiation energy impinges on the diode as indicated in FIG. 1, corresponding pulses of current flow in the series circuit and may be indicated in any suitable manner. To this end an indicator 13 is shown connected across resistor 12. The indicator may be a suitable pulse rate meter, register or other indicating apparatus known in the art, as meets the requirements of a particular application. With suitable selection of diode and operating conditions, the output pulses will be of sufficient amplitude so that only moderate degrees of amplification are required. For example, output pulse amplitudes of the order of 0.1 to 0.2 volt and even higher may be obtained across resistance 12.

The pulse voltage across the diode 10 will be equal and opposite in sign to that across resistor 12 so that a high-impedance indicator may be connected across the diode if desired.

Figure 2:
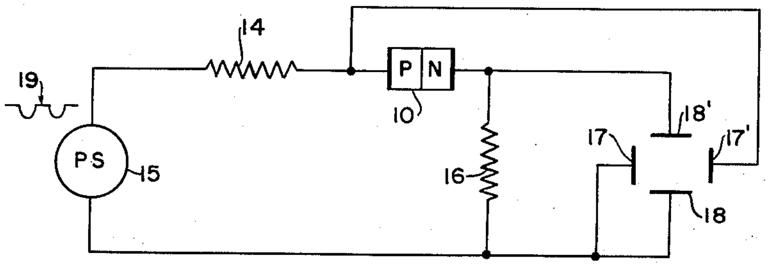
FIG. 2 is a schematic circuit diagram of a dynamic tracer usable to exhibit anomalous regions in diode characteristics.

Referring now to FIG. 2, a conventional apparatus is shown for determining dynamically the I–V characteristic of a diode. The diode 10 is in series with a current limiting resistor 14, a voltage source 15, and a current sampling resistor 16. The voltage across the diode is applied to the horizontal deflection circuit of an oscilloscope and is here shown as connected directly to the horizontal deflecting plates 17, 17' of an oscilloscope. Actually, the sum of the diode voltage and the voltage drop through resistor 16 is applied to the horizontal deflection circuit, but the resistance of 16 can be made sufficiently small so that the IR drop across it is small compared to the voltage across the diode throughout the measurement. Thus, the measurement is sufficiently precise for practical purposes.

The voltage across resistor 16 is directly proportional to the current therethrough, and hence directly proportional to the diode current. The voltage across resistor 16 is here shown as applied directly to the vertical deflecting plates 18, 18' of the oscilloscope.

In practice, oscilloscopes are commonly provided with built-in amplifiers for horizontal and vertical deflection, and the voltage across the diode and across resistor 16 will be applied to the inputs of these amplifiers. They are omitted here for simplicity of presentation.

Such dynamic tracers are often operated with a sine wave input at 60-cycle power line frequency so that the voltage applied to the diode extends in both forward and reverse directions. In such case, care must be taken not to exceed the current and power ratings of the diode in the forward direction. For present purposes, it is sufficient to display the characteristic only in the reverse direction. Accordingly, power supply 15 is arranged to supply a half-wave rectified voltage to the diode, as shown at 19. The polarity is such as to apply a voltage to the P terminal varying from substantially zero to a negative value in excess of the breakdown voltage. The value of resistor 14 is selected to avoid excessive diode current in the breakdown region.

When an I–V characteristic is displayed in this manner, it is often observed that at the onset of breakdown the characteristic is discontinuous or contains one or more small regions of multiple traces. Between these regions the characteristic is well defined.

Figure 3:
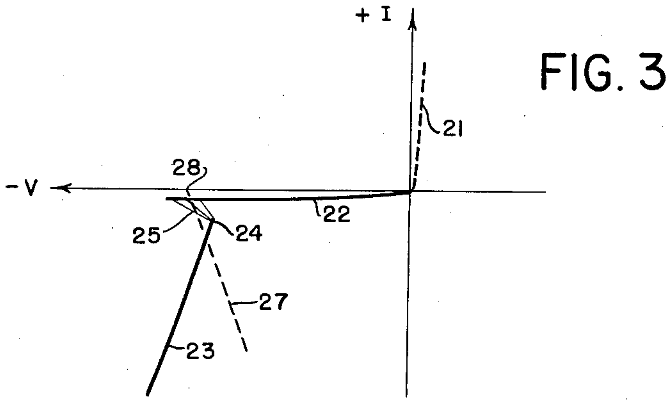
FIG. 3 is an illustrative characteristic obtained by the apparatus of FIG. 2.

Referring now to FIG. 3, an illustrative characteristic of a diode exhibiting an anomalous region is depicted. Voltage across the diode is shown along the horizontal coordinate and current through the diode along the vertical coordinate. The portion 21 in the forward region of the I–V characteristic is shown dotted since it is not obtained with the apparatus of FIG. 2. (If desired, the apparatus could be modified to apply a voltage extending into the forward conduction region so as to depict region 21.)

Beginning with zero applied voltage, as the voltage increases in the negative direction a well-defined portion 22 of the I–V characteristic is shown on the face of the oscilloscope. The current represented by this portion of the trace is somewhat exaggerated in FIG. 3 for clarity; it is commonly less than a microampere.

In the breakdown region a well-defined portion 23 of the characteristic is observed. This portion extends from a relatively low current at 24 to high currents of the same order of magnitude as those obtainable in the forward direction.

In diodes which exhibit anomalous regions, there will be a region 25 in the I–V characteristic which may show fainter lines connecting the extremities of lines 22 and 23, as shown in FIG. 3. These lines sometimes appear to scintillate. Or, it may be found that there is a gap in region 25 wherein no observable traces appear.

Occasionally diodes are found which exhibit two or more anomalous regions at progressively higher currents in the breakdown voltage region, with stable, well-defined characteristics therebetween.

Further information concerning these anomalous regions can be obtained with the circuit of FIG. 1, by connecting an oscilloscope across resistor 12. Using an internal horizontal time sweep in the oscilloscope, randomly occurring pulses are observed when the D.-C. voltage of source 11 is adjusted so that operation of the diode takes place through an anomalous region, as indicated by the dotted D.-C. load line 27 of FIG. 3.

These randomly occurring pulses are the amplitude versus time representation of the scintillating or multiple traces shown in region 25 of FIG. 3. The pulses are believed to be generated in the diode as a result of the random creation of minority carriers in the vicinity of the high field depletion layer or sub-regions thereof, and their subsequent transit across the layer or sub-regions thereof, with accompanying avalanche multiplication. It has been found that these minority carriers can be created by heat, by light, or by any other particles or photons of sufficient energy.

In the absence of other forms of incident energy the pulses which are observed have their genesis in the thermal creation of minority carriers. When the diode is exposed to sufficiently energetic incident radiation, additional pulses are generated and therefore the count rate increases. The diode and its circuit arrangement shown schematically in FIG. 1 therefore constitute a radiation detector or counter. If the incident radiation is very feeble, it may be masked by the background thermally-created pulses. In such cases it is desirable to reduce the ambient temperature of the diode. This reduces the thermal background masking count and thereby augments the sensitivity of the diode as a radiation detector or counter.

Another form of background count which is occasionally encountered occurs when the diode encapsulation consists of material which is partially or wholly transparent to light. In such cases, it may be desirable to provide shield means for insuring that ambient light does not reach the diode, thus eliminating this source of background count. Such shield means may be an opaque coating on the diode, an opaque container around the diode, etc., and is indicated by the dotted line 26 in FIG. 1.

When a diode, whose characteristic exhibits an anomalous region, is operated through portion 22 or 23 of FIG. 3 and an oscilloscope is connected across the resistor 12 of FIG. 1, pulses will ordinarily be non-existent.

Returning to FIG. 3, when the diode has a relatively high background count as discussed above, scintillating beads or multiple traces will ordinarily be observed in region 25. If the diode has a relatively low background count, a gap may be observed.

The desired operation in the anomalous region is obtained by proper selection of the applied bias voltage and the series impedance. As well understood in the electronics field, these parameters determine a D.-C. load line along which operation must take place. Such a load line is shown at 27 in FIG. 3. The applied bias voltage has a value corresponding to point 28, and for zero current through the diode this is the voltage thereacross. As the current increases, a voltage drop is produced across the series resistor and the diode voltage decreases, as shown by line 27. The slope of line 27 is equal to the reciprocal of the series resistance. In accordance with the invention, the value of the bias voltage and series resistance is selected so that the load line 27 passes through the anomalous region 25. Various combinations of voltage and resistance may be employed to obtain this operation.

When the diode exhibits two or more anomalous regions, it is preferred to operate through the lowest current anomalous region. However, if desired, operation through a higher current anomalous region can be employed. This can be obtained by selection of voltage and resistance to produce a load line passing through the selected region.

As a further aid to the ready practice of the invention, certain illustrative data will be given, it being understood that the invention is not confined thereto. Certain presently commercial diodes have been found which are particularly likely to exhibit the anomalous regions discussed herein. These include the type 1N138, the Hughes type 6008, and the Hoffman Electronics type 1N209. These are silicon junction diodes, but anomalous regions have also been found in the characteristics of some commercial germanium junction diodes.

With a Hughes type 6008 diode at a temperature of −78° C. and operated with about 230 volts bias, the background thermal count was about 5 per second. With a 40 microcurie $Sr^{90}$—$Y^{90}$ source of beta rays taped to the diode, the count was about 40 per second.

In another Hughes type 6008 diode, operated at −19° C., and at about 240 volts, the background thermal count was about 5 per second. With two 40 microcurie sources taped to the diode, the count was about 50 per second.

With a Hoffman Electronics type 1N209 operated at 0° C., and at about 60 volts, the background thermal count was about 0.5 per second. With two 40 microcurie sources, the count was about 3 per second.

With more intense sources of radiation, operation at room temperature has been employed with success.

The value of the series resistance may be varied over a considerable range, depending upon the other operating parameters. For example, values ranging from less than 100 ohms to several hundred thousand ohms have been employed with success. For optimum operation it is desirable to provide some means for initially adjusting the resistance and voltage.

Means for cooling the diode, when desired, is shown by the dotted line 29 in FIG. 1. The type of cooling apparatus employed will depend on the desired low temperature to be produced and on the requirements of the particular application. For moderate degrees of cooling, immersing the diode in a Dewar flask containing ice water is effective. For lower temperature operation, the ice water may be replaced by well-known lower temperature liquids.

When unshielded, the counter will respond to any penetrating radiation which is sufficiently energetic. When it is desired to detect or count a particular type or particular types of radiation, appropriate shielding may be employed so that essentially only the desired radiation impinges on the diode.

It will now be appreciated that the solid state radiation detector or counter of the invention has many attractive features. It is very small, extremely fast in operation, can be used with moderate voltages and is capable of very high resolution.

I claim:

1. A radiation detector or counter which comprises a semiconductor diode exhibiting breakdown at a breakdown voltage in the reverse-voltage direction, said diode having an anomalous region in the I–V characteristic in the breakdown region thereof near said breakdown voltage, a bias source and impedance in series with said diode establishing operation through said anomalous region, and a pulse indicator included in the diode circuit, whereby pulses due to radiation impinging on said diode may be indicated.

2. A radiation detector or counter which comprises a semiconductor diode exhibiting avalanche breakdown at a breakdown voltage in the reverse-voltage direction, said diode having an anomalous region in the I–V characteristic in the breakdown region thereof near said breakdown voltage, a bias source and resistance in series with said diode establishing a load line through said anomalous region, and a pulse indicator included in the diode circuit, whereby pulses due to radiation impinging on said diode may be indicated.

3. A radiation detector or counter which comprises a semiconductor P-N junction diode element exhibiting avalanche breakdown at a breakdown voltage in the reverse-voltage direction, said diode having an anomalous region in the I–V characteristic in the breakdown region thereof near said breakdown voltage, a bias source and resistance element in series with said diode establishing a D.-C. load line through said anomalous region, and a pulse indicator connected across one of said resistance and diode elements, whereby pulses due to radiation impinging on said diode may be indicated.

4. A radiation detector or counter which comprises a semiconductor diode exhibiting breakdown at a breakdown voltage in the reverse-voltage direction, said diode having an anomalous region in the I–V characteristic in the breakdown region thereof near said breakdown voltage, a series circuit including a bias source, impedance and said diode, said bias source and impedance being predetermined to establish operation through said anomalous region of the diode, whereby current pulses flow in said series circuit in response to radiation impinging on said diode, a pulse indicator connected to said circuit for indicating said pulses, and means for cooling said diode to reduce the background count thermally-generated therein.

5. A radiation detector or counter which comprises a semiconductor P-N junction diode element exhibiting avalanche breakdown at a breakdown voltage in the reverse-voltage direction, said diode having an anomalous region in the I–V characteristic in the breakdown region thereof near said breakdown voltage, a series circuit including a bias source, a resistance element and said diode, said bias source and resistance element being predetermined to establish a D.-C. load line through said anomalous region of the diode, whereby current pulses flow in said series circuit in response to radiation impinging on said diode, a pulse indicator connected across one of said resistance and diode elements for indicating said pulses, and means for cooling said diode to reduce the background count thermally-generated therein.

6. A radiation detector or counter which comprises a semiconductor diode exhibiting breakdown at a breakdown voltage in the reverse-voltage direction, said diode having an anomalous region in the I–V characteristic in the breakdown region thereof near said breakdown voltage, a series circuit including a bias source, impedance and said diode, said bias source and impedance being predetermined to establish operation through said anomalous region of the diode, whereby current pulses flow in said series circuit in response to radiation impinging on said diode, a pulse indicator connected to said circuit for indicating said pulses, and a light-opaque shield around said diode.

References Cited in the file of this patent

UNITED STATES PATENTS

| | | |
|---|---|---|
| 2,650,311 | Bray et al. | Aug. 25, 1953 |
| 2,670,441 | McKay | Feb. 23, 1954 |
| 2,671,154 | Burstein | Mar. 2, 1954 |
| 2,692,950 | Wallace | Oct. 26, 1954 |
| 2,745,973 | Rappaport | May 15, 1956 |
| 2,753,462 | Moyer et al. | July 3, 1956 |
| 2,774,887 | McMaster et al. | Dec. 18, 1956 |
| 2,777,956 | Kretzmer | Jan. 15, 1957 |
| 2,819,442 | Goodrich | Jan. 7, 1958 |
| 2,854,651 | Kircher | Sept. 30, 1958 |
| 2,867,727 | Welker et al. | Jan. 6, 1959 |
| 2,885,562 | Marinace et al. | May 5, 1959 |